United States Patent [19]
Ishii et al.

[11] Patent Number: 4,992,329
[45] Date of Patent: Feb. 12, 1991

[54] MAGNETIC-SHIELDING SHEET

[75] Inventors: Hiroyoshi Ishii; Kenzo Suzuki; Misao Kaneko, all of Kumagaya; Noboru Ishikawa, Tokyo, all of Japan

[73] Assignee: Kabushikikaisha Riken & Simizu Construction Co., Tokyo, Japan

[21] Appl. No.: 328,746

[22] Filed: Mar. 24, 1989

Related U.S. Application Data

[63] Continuation of Ser. No. 29,039, Mar. 23, 1987.

[30] Foreign Application Priority Data

Mar. 24, 1986 [JP] Japan ................... 61-65345

[51] Int. Cl.$^5$ .................. B32B 5/16; B32B 15/08; H05K 9/00
[52] U.S. Cl. ................... 428/328; 428/329; 428/357; 428/457; 428/461; 428/900; 174/35 MS; 148/403
[58] Field of Search .............. 428/328, 329, 331, 357, 428/457, 900, 922, 461; 369/293; 252/62.59; 174/35 R, 35 MS; 148/403

[56] References Cited

U.S. PATENT DOCUMENTS

| | | | |
|---|---|---|---|
| 3,790,407 | 2/1974 | Merten et al. | 428/328 |
| 4,126,287 | 11/1978 | Mendelsohn et al. | 148/403 X |
| 4,197,146 | 4/1980 | Frischmann | 148/108 |
| 4,215,084 | 7/1980 | Maringer | 264/8 |
| 4,447,492 | 5/1984 | McKaveney | 174/35 MS |
| 4,474,676 | 10/1984 | Ishino et al. | 174/35 MS |

FOREIGN PATENT DOCUMENTS 0027290  4/1981  Japan ................... 174/35 MS

*Primary Examiner*—George F. Lesmes
*Assistant Examiner*—Christopher Brown

[57] ABSTRACT

A magnetic-shielding sheet comprising a laminated-structure layer of soft magnetic amorphous alloy flakes, said soft magnetic amorphous alloy flakes being of 5 to 100 μm thick and 10-15000 in aspect ratio (ratio of maximum length to maximum thickness) is provided.

6 Claims, 5 Drawing Sheets

4,992,329

MAGNETIC-SHIELDING SHEET

This applicaiton is a continuation of applicaiton Ser. No. 029,039, filed Mar. 23, 1987, now abandoned.

BACKGROUND OF THE INVENTION

1. Field of the Invention

The present invention relates to a magnetic-shielding sheet.

2. Description of the Prior Art

Precise electric instruments, such as those for measurement frequently cause error in measurement value or erroneous operation when exposed to leakage flux from household electric appliances, office automation apparatus, building steel frames, etc. Also terrestrial magnetism may affect adversely precise electrical instruments. Thus for example, countermeasure is tentatively taken that a measurement room in which precise electrical instruments are disposed is enclosed with magnetic shielding material for protecting them against an external magnetic field. As such magnetic-shielding material are used silicon steel sheets or permalloy. These however are disadvantageous in having so poor of a magnetic-shielding ability that they are required to be processed into considerably thick sheets for use, reflecting on inconvenience and uneconomy.

Attention is being paid to amorphous alloys useful as various functional materials, which have distinguishable chemical and mechanical properties from those of crystalline alloys. Above all, iron- or cobalt-based amorphous alloy does not have crystal anisotropy, and exhibits greatly superior soft magnetic properties associated with it, i.e. very small coercive force and high magnetic permeability. Thus it is promising to be put into practice by the utilization of these properties.

On the other hand, amorphous alloys are usually available in the form of ribbon (several tens $\mu$m in thickness and 100 mm in width), which must be cut into pieces and laminated to be processed into sheets of desired dimensions. In this processing, cutting may be accompanied by occasional damage, and lamination presents problems of superposition and bonding. Besides, a desired thickness is obtainable only by laminating a number of layers, thus with many processes, reflecting unfavorably on producibility.

OBJECT AND SUMMARY OF THE INVENTION

Accordingly, it is an object of the present invention to provide a magnetic-shielding sheet superior in magnetic-shielding ability against external magnetic field including static and low frequency magnetic field and high in producibility.

As the result of a concentrated endeavor of study, the inventors have discovered that a magnetic amorphous alloy is processed into flakes, and a magnetic-shielding sheet comprising laminated magnetic amorphous alloy flakes is made. The thus-obtained sheet continues to have the above-mentioned satisfactory superior properties of magnetic amorphous alloy and, in addition, can be made efficiently. On the basis of this, the present invention has been accomplished.

The magnetic-shielding sheet according to the invention is a construction material having a layer of soft magnetic amorphous alloy flakes of thickness 5–100 $\mu$m and aspect ratio (ratio of maximum length to maximum thickness) 10–15000.

Soft magnetic amorphous alloy flakes (referred to as amorphous alloy flakes hereinafter) of less than 5 $\mu$m in thickness are difficult to make and those exceeding 100 $\mu$m in thickness sparingly become amorphous. Therefore suitable thicknesses are within the range between 5 and 100 $\mu$m, preferably 20 and 60 $\mu$m.

In amorphous alloy flakes, aspect ratios less than 10 are associated with lower magnetic permeability, and accompanied by change in magnetic characteristic. Additionally lamination, becomes difficulty. Thus in this case, the magnetic-shielding ability becomes deteriorated. On the other hand, aspect ratios exceeding 15000 makes working with amorphous alloy flakes troublesome and the producibility lower. Thus specially suitable aspect ratios are within the range of 50 to 10000.

DESCRIPTION OF THE PREFERRED EMBODIMENTS

Figure 1:
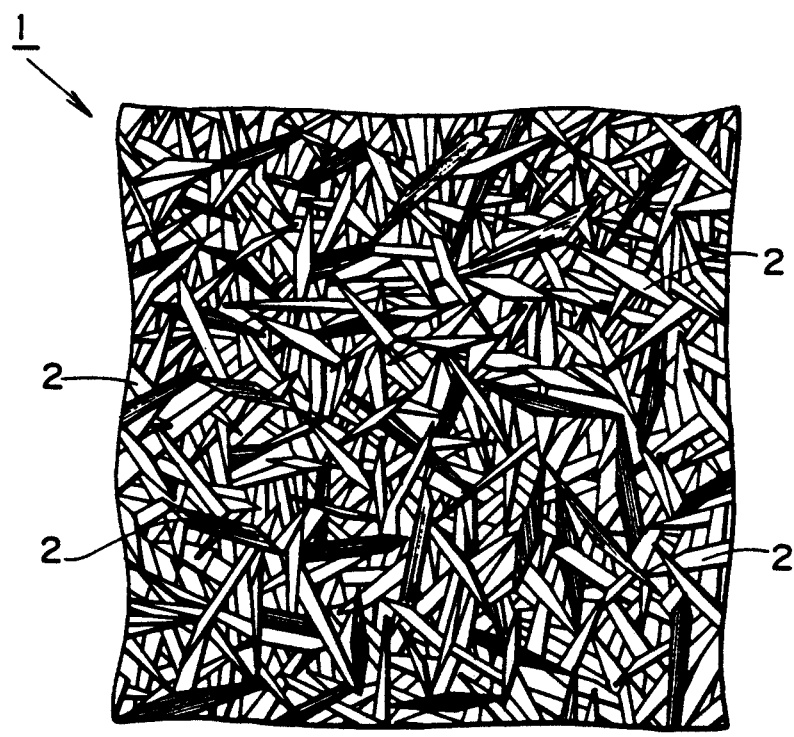
FIG. 1 is a plane view of a magnetic-shielding sheet.
Figure 2:
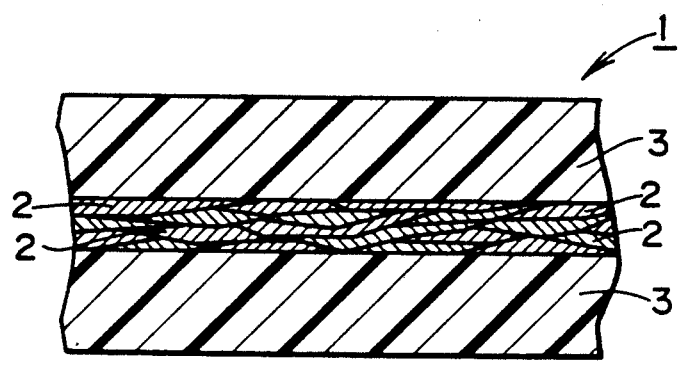
FIG. 2 is a cross-sectional view of the same in an enlarged scale.

FIGS. 1 and 2 show plan view with the reference character 3-designated upper sheet removed and an enlarged cross sectional view, respectively, of a magnetic-shielding sheet embodying the invention.

The magnetic-shielding sheet 1 is of construction material consisting of two outer layers 3 of films, for example acryl and vinyl chloride resin films and a layer 2 of amorphous alloy flakes interposed between them.

The magnetic-shielding sheet is manufactured by uniformly distributing predeterminedly-weighed amorphous alloy flakes between the films 3 and subsequently setting them therebetween. This can be accomplished very easily, in particular without needing any binder for example by a vacuum packing technique. In addition, alternative embodiments of the invention may be suitably chosen, as for example the so-called hot melting method comprising uniformly distributing soft magnetic amorphous alloy flakes between two films, one or both of which are provided on the internal surface with a binder resin coat, then heating under pressure to cause the binder resin to melt and penetrate among the amorphous alloy flakes, and subsequently causing them with aid of binder resin to be bound together to form an integrated magnetic-shielding sheet. In this case, individual amorphous alloy flakes 2 are distributed uniformly and directed at random, thus to form undirectional lamination. On the other hand, lamination of amorphous alloy ribbon or crystalline alloy strip is inevitably accompanied by repeated cutting and complex binding in cross directions and a variety of angle degrees for undirectional arrangement, with the consequent much troublesome work. Furthermore, as an alternative embodiment of the invention, directional arrangement of the amorphous alloy flakes, if desired, can be realized by subjecting them to uniform distribution under the condition where somewhat magnetic field is applied, thereby the amorphous alloy flakes are arranged in their longitudinal direction. Flexibility may be imparted to the magnetic-shielding sheet to make it convenient to be used by using the above-mentioned films as layer 3.

In the method according to the invention comprising causing two films between which amorphous alloy flakes are distributed to adhere closely under reduced pressure between them, the amorphous alloy flakes are forced to get together more densely and compactly with the effect of improving the magnetic-shielding ability.

The magnetic-shielding ability of the amorphous alloy flake is based on its chemical composition involved in soft magnetism. The cobalt-based amorphous alloy flake of magnetostriction $(-10 \text{ to} +10) \times 10^{-6}$ and magnetic permeability 1000 or more has a somewhat relatively low magnetic flux density and, magnetic-shielding sheet containing such flakes is required to have a somewhat larger thickness against a strong magnetic field but exhibits extremely good magnetic-shielding ability against a weak magnetic field. Against a strong magnetic field, the iron-based amorphous alloy flake of saturated magnetic flux density 12000 or more gausses exhibits a good magnetic-shielding ability even if used for a magnetic-shielding sheet of small thickness. Effective magnetic-shielding over the range of from strong magnetic field to very weak magnetic field up to the terrestrial magnetism results from disposition in layers or mixed state cobalt-based amorphous alloy flakes of magnetostriction $(-10 \text{ to} +10) \times 10^{-6}$ and magnetic permeability 1000 or more and iron-based amorphous alloy flakes saturated magnetic flux density 1200 or more gauses.

Amorphous alloy flakes can be manufactured by cutting ribbon or the known melt/extraction method. It is preferred from the view point of producibility and capability of thinning the edges of amorphous alloy squamose flakes to apply the cavitation process disclosed in Japanese laid-open Pat. No. 6907/1983, which comprises feeding a molten metal on the surface of the roller running at a high speed, the surface having a relatively small wettability to the molten metal, to brake the molten metal into fine molten droplets, and subsequently dashing the droplets against a metallic rotary member running at a high speed to solidify rapidly them.

The invention will be described more fully by way of examples hereinafter:

EXAMPLE 1

According to the above-mentioned cavitation process, amorphous alloy flakes of an elemental composition: Co 68.8%, Fe 4.2%, Si 16% and B 11% (referred to as $C_{68.8}Fe_{4.2}Si_{16}B_{11}$) were prepared and its properties were as follows: magnetostriction 0, saturated magnetic flux density 7000 gausses, magnetic permeability 10000, average thickness 40 μm and aspect ratio 200 to 500.

Using the obtained amorphous alloy flakes, the magnetic-shielding sheet I as illustrated in FIGS. 1 and 2 was manufactured under ordinary pressure according to the above-described process. The outer layers 3 were of acrylic resin and bound together at their edges by the use of a binder (not shown).

The resulting magnetic-shielding sheet in the form of construction sheet was investigated for their magnetic-shielding ability with an apparatus shown in FIG. 3, in the following way: There is provided a magnetic field source comprising a core 4 consisting of electromagnetic steel sheets or silicon steel sheets and a magnetizing coil 5 wound about the core 4. Exciting current was caused to flow through the magnetizing coil 5, and magnetic flux 6 was generated from the magnetic field source. Then the strength of leakage flux through the magnetic-shielding sheet 1 was measured by means of a detection coil 7 at a distance of 100mm (designated by $l_1$ in the Figure) from the end plane of the core 4. On the basis of the thus-obtained results, magnetic-shielding ability was evaluated. The magnetic-shielding sheet 1 was disposed at a distance of 15 mm (designated $l_2$ in the Figure) from the detection coil 7 towards the core 4. The strength of magnetic field which reflects magnetic flux 6 can be changed with exciting current through the magnetizing coil 5.

Figure 3:
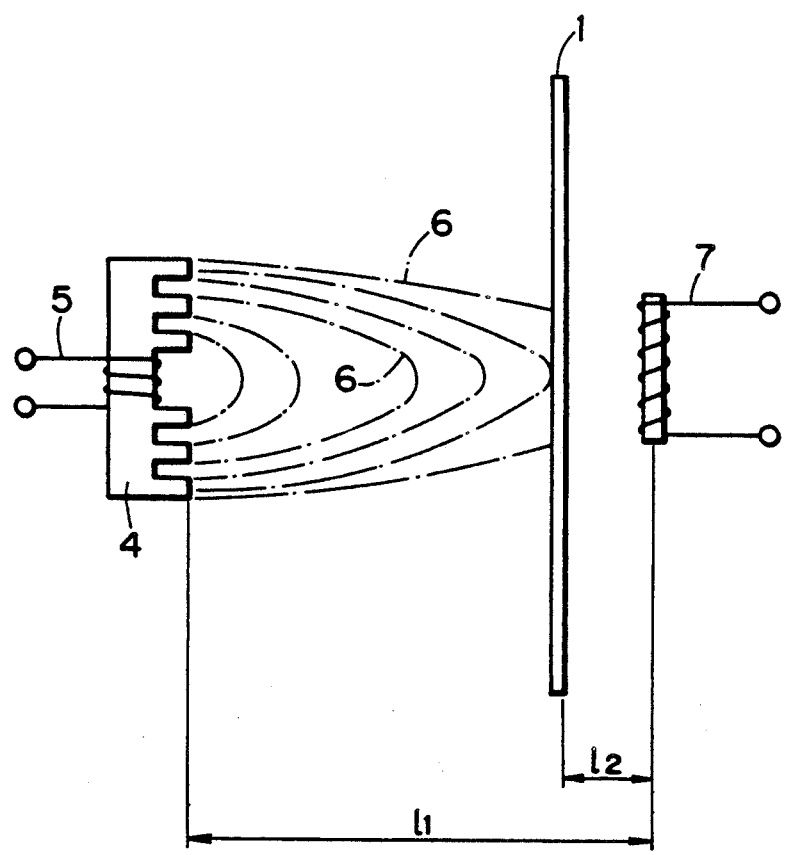
FIG. 3 is a schematically-illustrative view of the parts of a leakage flux measuring instrument.
Figure 4:
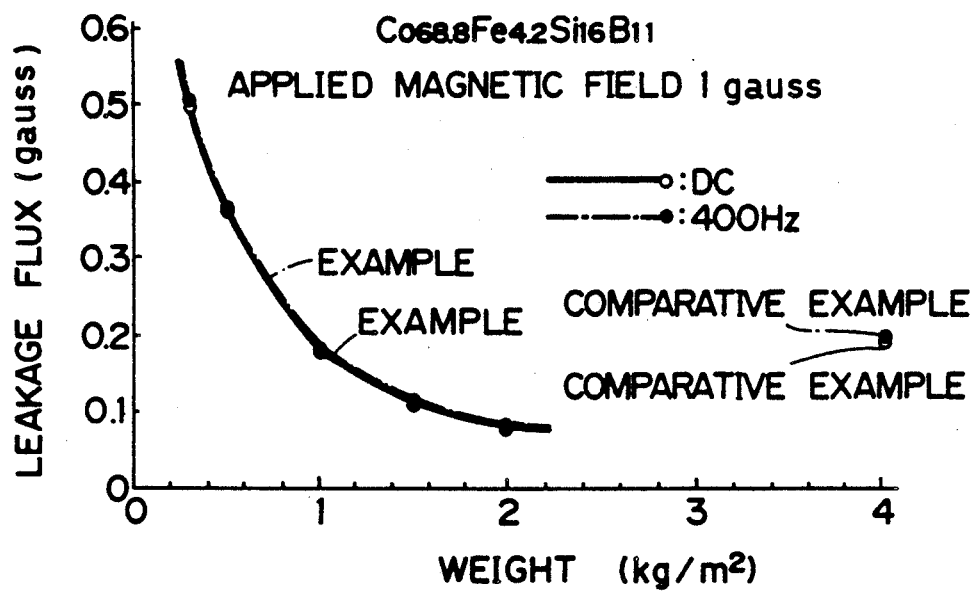
FIGS. 4 and 5 are graphical representation, with a magnetic-shielding sheet, of the relationship between leakage flux under an impressed magnetic field and weight of per unitary area (kg/m$^2$)

Using the instrument illustrated in FIG. 3, leakage flux transmitting through a sample of magnetic-shilding sheet was measured. The magnetizing coil 5 was connected to DC and AC (400Hz) power supply, respectively. A group of magnetic-shielding sheets containing magnetic-shielding flakes, of which weights per unitary area (kg/m²) vary serially, were used to obtain the characteristic curve. In this Example, applied magnetic field was 1 gauss. The results obtained are graphically represented in FIG. 4.

For comparison are shown also the results of similar measurement of an undirectional silicon steel sheet of 0.5mm thick commercially available. In this example, the results obtained by application of DC and AC (or static or alternating magnetic field), respectively, were substantially the same. The material obtained in this example gave substantial the same value with 1kg/m² as that with 4kg/m²) of the undirectional silicon steel sheet used as reference, this demonstrates that the former with about ¼ by kg/m² of the latter, is equivalent in magnetic-shielding ability to the latter. It is a matter of course that increase in weight/m² of material contributes to improvement in magnetic-shielding.

EXAMPLE 2

Except that the amorphous alloy flakes obtained in Example 1 were uniformly distributed under reduced pressure of 1 Torr, all were carried out in the same way as in Example 1 to attain magnetic-shielding sheets in the form of construction sheet.

Figure 5:
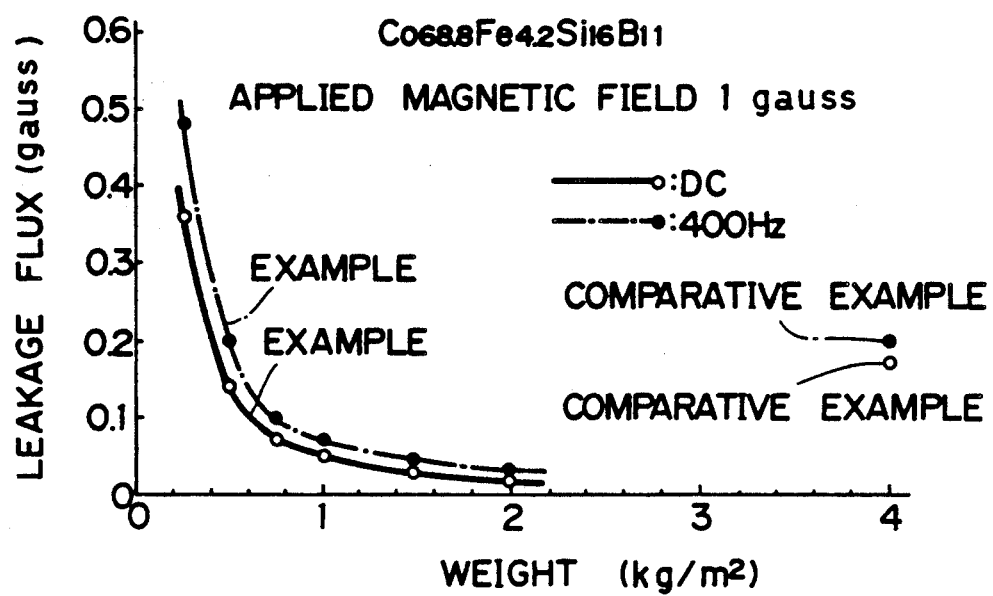

The obtained magnetic-shielding sheets were measured in the same way as in Example 1, and the yielded results are as graphically shown in FIG. 5, in which the results of the undirectional silicon steel sheets of 0.5 mm thick as reference are shown, too.

As FIG. 5 shows, against static magnetic field, the magnetic-shielding ability with 0.4kg/m² is substantially equivalent to that of the undirectional silicon steel sheet. In other words, the equivalent magnetic-shielding ability is attainable with 1/10 by kg/m² compared with the reference, this enabling greatly lessening necessary weight of magnetic-shielding sheet. Besides substantially the same magnetic shielding ability as against static magnetic field was exhibited against alternating magnetic field.

Figure 6:
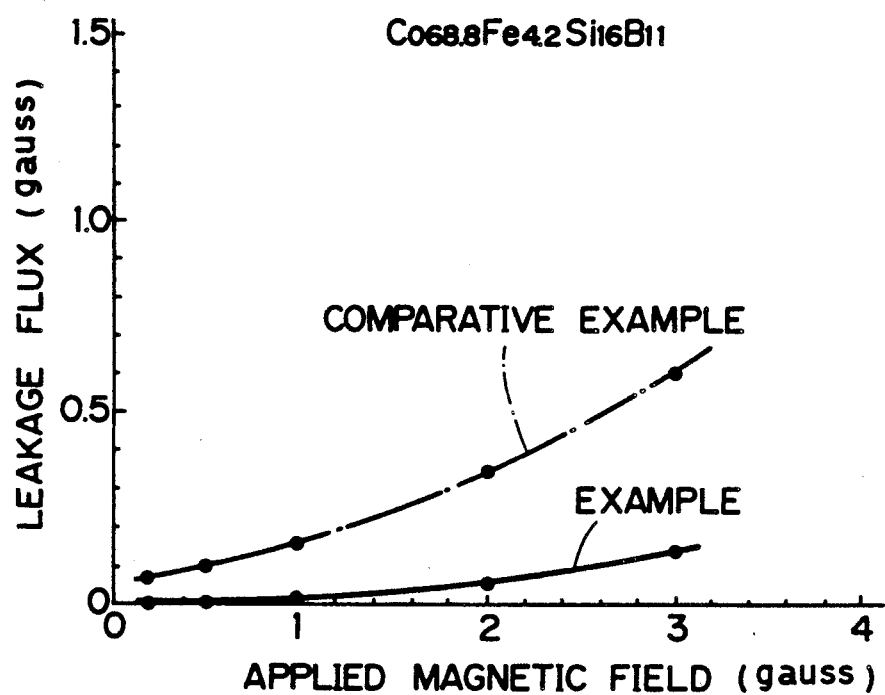
FIG. 6 is a graphic representation of magnetic field strength-leakage flux curve.

FIG. 6 shows graphically the comparative results of the material of this Example (1.8kg/m²) and the reference (undirectional silicon steel sheet of 4kg/m²) measured at varying strengths of impressed magnetic field.

As seen from FIG. 6, the material obtained in this Example, with less than a half by kg/m² of the reference, exhibited remarkably superior magnetic-shielding ability at any applied magnetic field strength. Complete shielding by this material is shown against the terrestrial magnetism.

EXAMPLE 3

In the same way as in Example 1, amorphous alloy flakes of a chemical composition $Fe_{72}Co_8Si_5B_{15}$ were prepared, and the properties measured were magnetostriction $+40\times10^{-6}$, saturated magnetic flux density 16500 gausses, average thickness 40 μm and aspect ratio 200 to 500.

Using the amorphous alloy flakes, magnetic-shielding sheets in the form of construction sheet were manufactured under reduced pressure of 1 Torr in the same way as in Example 2.

Figure 7:
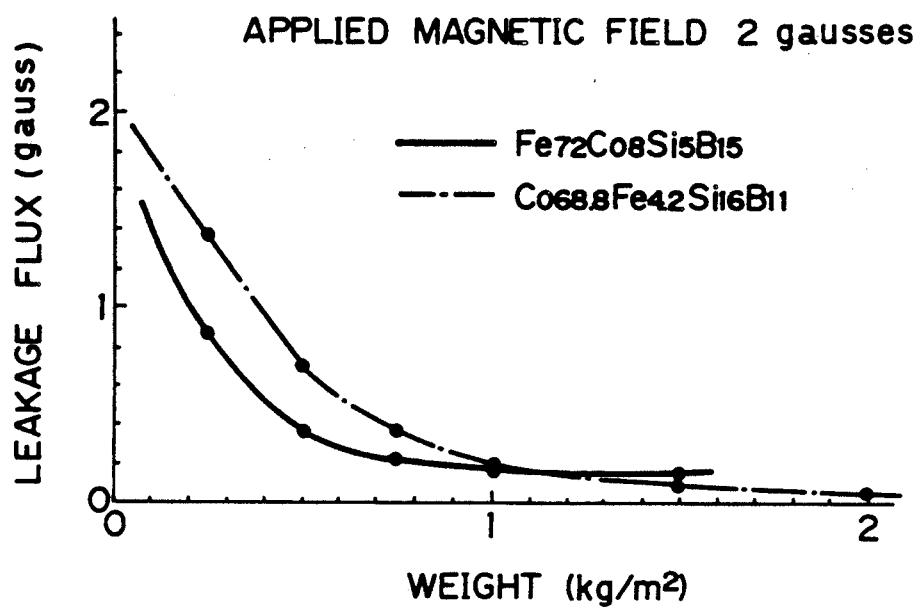
FIG. 7 is a graphic representation, with a magnetic shielding sheet, of the relationship between leakage flux under an impressed magnetic field of 2 gausses and weight per unitary area (kg/m$^2$)

Leakage flux measurement was carried out in the same as above-mentioned, of 2 types of magnetic-shielding sheets, one obtained in this Example and the other containing $Co_{68.8}Fe_{4.2}Si_{16}B_{11}$ flakes obtained in Example 2. A static magnetic field of 2 gausses was applied. The obtained results are graphically represented in FIG. 7.

The magnetic-shielding sheet containing the $Co_8Fe_{4.2}Si_{16}B_{11}$ amorphous alloy flakes (referred to as $Co_{68.8}Fe_{4.2}Si_{16}B_{11}$ laminated material) exhibited a good magnetic-shielding ability against weak magnetic field of about 1 gauss as above-stated in Example 1 but was slightly inferior to the magnetic-shielding sheet containing the $Fe_{72}Co_8Si_5B_{15}$ amorphous alloy flakes (referred to as $Fe_{72}Co_8Si_5B_{15}$ laminated material) against a strong magnetic field of 2 gausses because of its lower magnetic flux density of 7000 gausses. On the other hand, against a strong magnetic field of 2 gausses, the $Fe_{72}Co_8Si_5B_{15}$ laminated sheet which had a higher saturated magnetic density exhibited with smaller kg/m² a superior magnetic-shielding ability to that of the $Co_{68.8}Fe_{4.2}Si_{16}B_{11}$ laminated sheet. Within the range of up to about 1 kg/m², the $Fe_{72}Co_8Si_5B_{15}$ laminated sheet exhibited superior magnetic-shielding ability.

EXAMPLE 4

TWo types of $Co_{68.8}Fe_{4.2}Si_{16}B_{11}$ and $Fe_{72}Co_8Si_5B_{15}$ amorphous alloy flakes obtained in Exampleε 1 and 3 were blended together in mixing ratio of 1 to 1, and processed under reduced pressure of 1 Torr in the same way as in Examples 2 and 3, respectively, into a magnetic-shielding sheet of 1 kg/m² in the form of construction sheet.

This magnetic-shielding sheets and the undirectional silicon steel sheet (thickness 0.5 mm, 4kg/m²) as reference were measured about leakage flux at varying strengths of static magnetic field applied.

Figure 8:
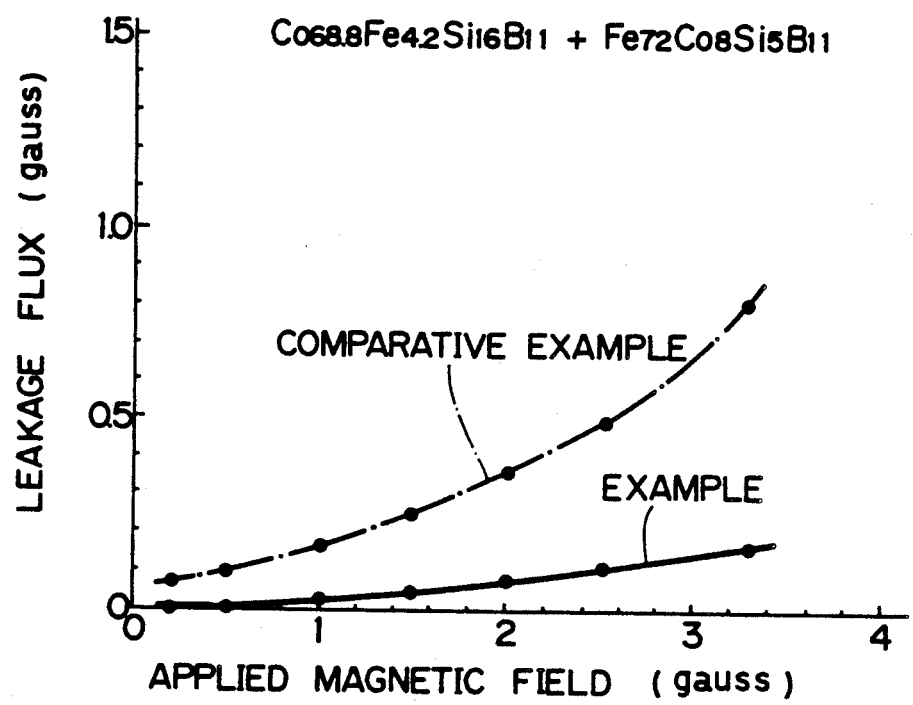
FIG. 8 is a graphic representation, with a dual component (two types of amorphous alloy flakes) magnetic shielding sheet, the relationship between magnetic field strength and leakage flux.

The yielded results are graphically represented in FIG. 8, which indicates that the xaterial obtained in this example with ¼ by kg/m² of the reference exhibited much good xagnetic-shielding ability compared with the reference.

EXAMPLE 5

Following the cavitation technique were prepared two types of amorphous alloy flakes, one having a chemical composition $Co_{68.8}Fe_{4.2}Si_{16}B_{11}$, average thickness 40 μm and aspect ratio 3 to 10 (as reference) and the other which is the same except for aspect ratio of 50 to 100. Aspect ratio can be changed with circumferential speed of the running roller.

Amorphous alloy flakes (a predetermined amount) of each of the above-mentioned types were distributed and set between two films to form a magnetic-shielding sheet in the same way as in Example 1, which were measured about magnetic-shielding characteristics.

Figure 9:
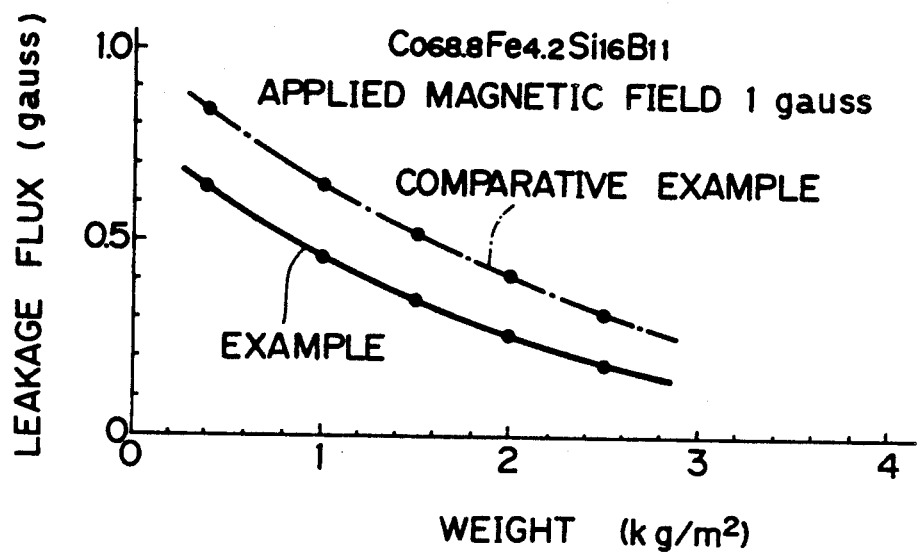
FIG. 9 is a graphic representation of the relationship at a different aspect ratio between leakage flux and weight per unitary area (kg/m$^2$).

The yielded results, as graphically shown in FIG. 9, demonstrates that the reference (aspect ratio 3 to 10) exhibited a lower magnetic-shielding ability than that of the material of aspect ratio 50 to 100.

Moreover amorphous alloy flakes of less than 5 μm thick failed to be prepared, and similar alloy flakes obtained exceeding 100 μm in thickness was observed to contain crystalline portions.

The results yielded in these Examples demonstrate the features and effects of the magnetic-shielding sheets according to the invention as summarized in the following:

(1) The structure in which soft magnetic amorphous alloy flakes are laminated produces small coercive force and high magnetic permeability, with the resultant remarkably good magnetic shielding ability, which enabling effective shielding against external magnetic field.

(2) The amorphous alloy flakes of thickness 5 to 100μm and aspect ratio 10 to 15000 can be contained in compact state or minimized space in the magnetic-shielding sheet, contributing to efficient magnetic-shielding.

(3) The above-stated dimensions of the amorphous alloy flakes permits easier lamination of them with the effect of high producibility of magnetic-shielding sheet.

It is a matter of course that, instead of cobalt-based and iron-based amorphous alloy flakes used in Examples above-described, those containing as base constituent nickel, or any mixture of at least 2 selected from the group consisting of cobalt, iron and nickel may be used.

It will be evident that various modifications can be made to the described embodiments without departing from the scope of the present invention.

What is claimed is:

1. A magnetic-shielding sheet against static and low frequency magnetic fields having flexibility and comprising a laminated-structural layer of soft magnetic amorphous alloy flakes being interposed between non-metal films, each of said soft magnetic amorphous alloy flakes being 20 to 60 μm thick and having an aspect ratio of 50 to 10,000; said soft magnetic amorphous alloy flakes being distributed along said non-metal film's plane direction in such a manner that said flakes substantially contact each other and are laminated in said non-metal film's thickness direction in such a manner as to substantially contact each other.

2. A magnetic shielding sheet as claimed in claim 1 wherein said soft magnetic amorphous alloy flakes are cobalt-based amorphous alloy flakes of magnetostriction $(-10$ to $+10)\times 10^{-6}$ and magnetic permeability 1000 or more.

3. A magnetic shielding sheet as claimed in claim 1 wherein said soft magnetic amorphous alloy flakes are iron based amorphous alloy flakes of magnetic flux density 12000 gausses or more.

4. A magnetic shielding sheet as claimed in claim 1 wherein said soft magnetic amorphous alloy flakes are composed of cobalt-based amorphous alloy flakes of magnetostriction $(-10$ to $+10)\times 10^{-6}$ and magnetic permeability 1000 or more and an iron-based amorphous alloy flakes of magnetic flux density 12000 gausses or more.

5. A magnetic shielding sheet as claimed in claim 1 wherein said soft magnetic amorphous alloy flakes are laminated in the state uniformly distributed and directed at random.

6. A magnetic shielding sheet as claimed in claim 1 wherein said soft magnetic amorphous alloy flakes are flaked or squamose pieces.

* * * * *